US010867110B2

(12) United States Patent
Lee et al.

(10) Patent No.: US 10,867,110 B2
(45) Date of Patent: Dec. 15, 2020

(54) METHOD OF FABRICATING A SEMICONDUCTOR DEVICE

(71) Applicant: Samsung Electronics Co., Ltd., Suwon-si (KR)

(72) Inventors: Sooyong Lee, Yongin-si (KR); Bong-Soo Kang, Seoul (KR); Kyoil Koo, Hwaseong-si (KR); Sangtae Kim, Seoul (KR); Kang-Min Jung, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/439,044

(22) Filed: Jun. 12, 2019

(65) Prior Publication Data

US 2020/0143010 A1    May 7, 2020

(30) Foreign Application Priority Data

Nov. 6, 2018  (KR) .......................... 10-2018-0135127

(51) Int. Cl.
*G06F 30/398* (2020.01)
*G03F 1/36* (2012.01)

(52) U.S. Cl.
CPC .............. *G06F 30/398* (2020.01); *G03F 1/36* (2013.01)

(58) Field of Classification Search
CPC ................................. G06F 30/398; G03F 1/36
See application file for complete search history.

(56) References Cited

U.S. PATENT DOCUMENTS

| 5,650,854 | A | 7/1997 | Sugawara |
| 5,736,280 | A | 4/1998 | Tsudaka |
| 7,466,405 | B2 | 12/2008 | Akutagawa et al. |
| 9,117,053 | B2 | 8/2015 | Wang |
| 9,311,700 | B2 | 4/2016 | Daneshpanah et al. |
| 9,448,495 | B2 | 9/2016 | Nakayama et al. |
| 9,658,527 | B2 | 5/2017 | Dmitriev |
| 9,863,761 | B2 | 1/2018 | Shi et al. |
| 9,875,534 | B2 | 1/2018 | Sezginer et al. |
| 2007/0065732 | A1 | 3/2007 | Lee et al. |
| 2007/0081137 | A1* | 4/2007 | Lin ........................ G03B 27/52 355/55 |
| 2013/0038716 | A1 | 2/2013 | Cho et al. |

FOREIGN PATENT DOCUMENTS

JP    2004053683 A    2/2004
JP    4515012 B2    7/2010

* cited by examiner

*Primary Examiner* — Vuthe Siek
(74) *Attorney, Agent, or Firm* — Harness, Dickey & Pierce, P.L.C.

(57) ABSTRACT

A method of fabricating a semiconductor device includes designing a layout, forming a photomask based on the layout, correcting an optical transmittance of the photomask, and performing a photolithography process using the photomask having the corrected optical transmittance to form a pattern on a substrate. The correcting the optical transmittance of the photomask includes creating an intensity map by capturing light that passes through the photomask, simulating the layout to create a virtual intensity map, and correcting an optical transmittance of a mask substrate of the photomask based on the intensity map and the virtual intensity map.

19 Claims, 16 Drawing Sheets

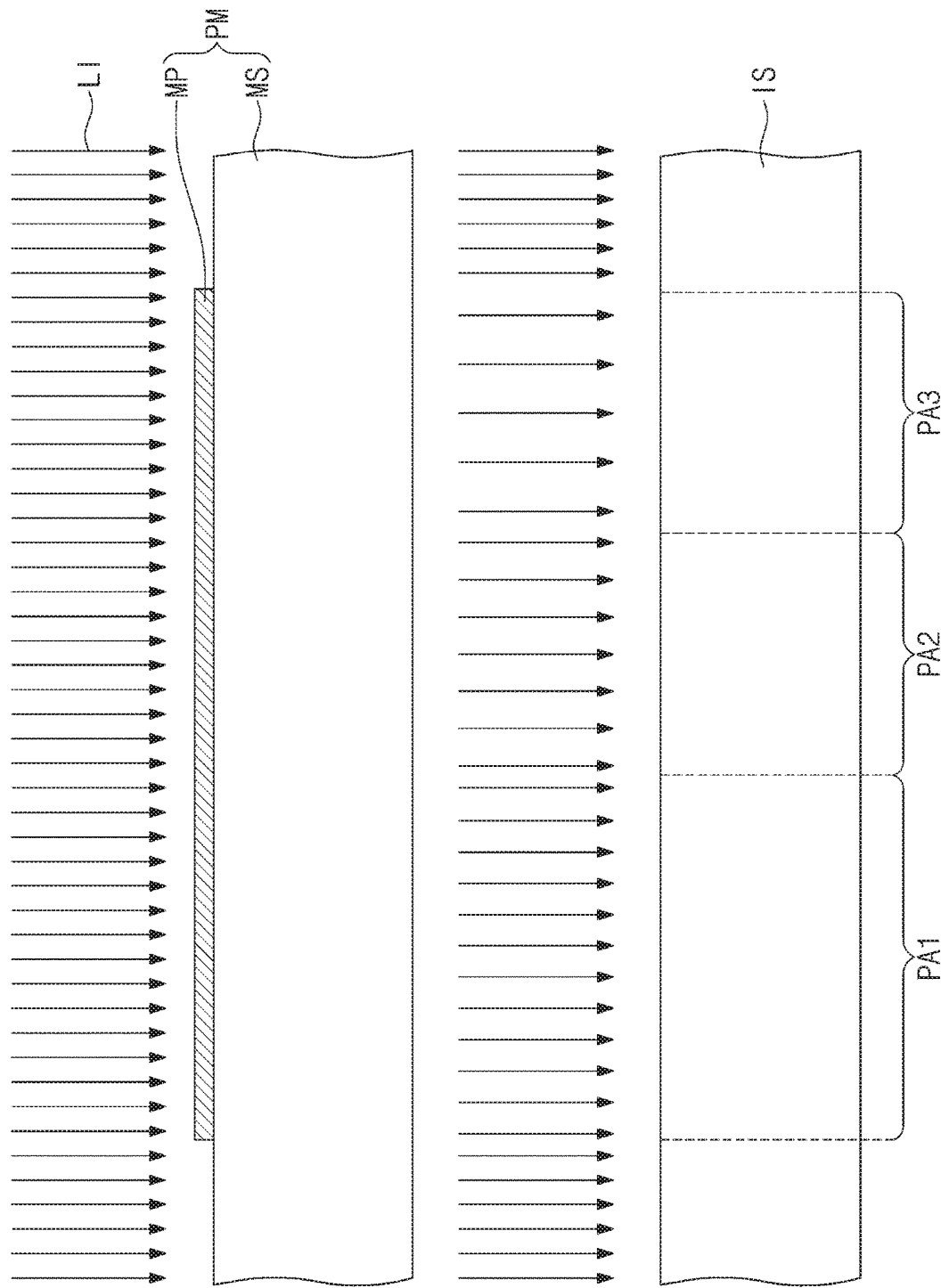

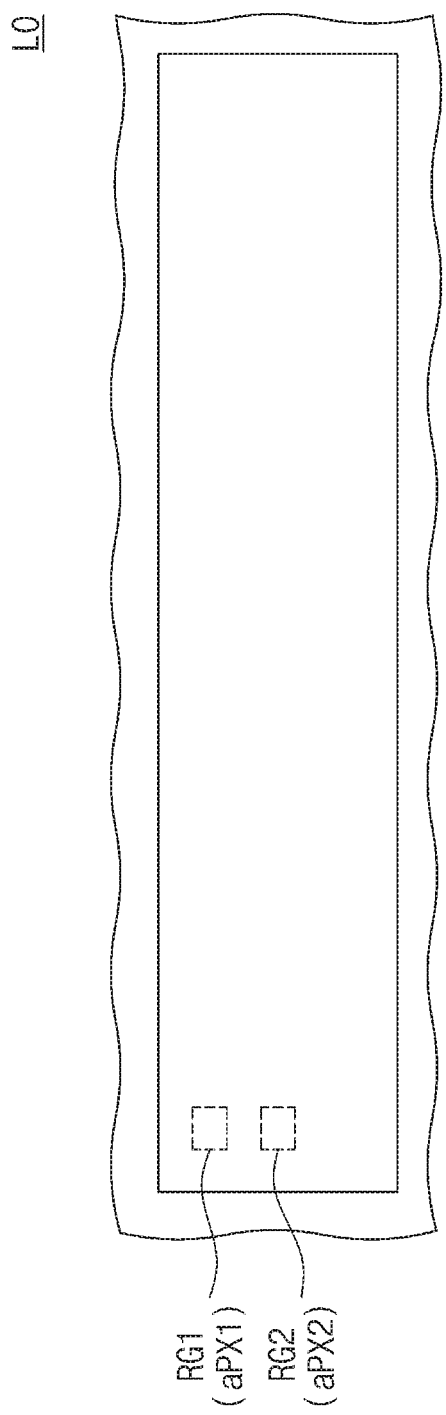

METHOD OF FABRICATING A SEMICONDUCTOR DEVICE

CROSS-REFERENCE TO RELATED APPLICATION

This U.S. nonprovisional application claims priority under 35 U.S.C § 119 to Korean Patent Application No. 10-2018-0135127 filed on Nov. 6, 2018 in the Korean Intellectual Property Office, the entire contents of which are hereby incorporated by reference.

BACKGROUND

Some example embodiments of the present inventive concepts relate to a method of fabricating a semiconductor device, and more particularly, to a method of fabricating a semiconductor device, in which method an optical transmittance of a photomask is corrected.

Semiconductor devices are beneficial in electronic industry because of their small size, multi-functionality, and/or low fabrication cost. Semiconductor devices may encompass semiconductor memory devices storing logic data, semiconductor logic devices processing operations of logic data, and hybrid semiconductor devices having both memory and logic elements. Semiconductor devices have been increasingly required for high integration with the advanced development of electronic industry. For example, semiconductor devices have been increasingly requested for high reliability, high speed, and/or multi-functionality. Semiconductor devices have been gradually complicated and integrated to meet these requested characteristics.

SUMMARY

Some example embodiments of the present inventive concepts provide a method of fabricating a semiconductor device, which method is able to efficiently correct an optical transmittance of a photomask.

According to some example embodiments of the present inventive concepts, a method of fabricating a semiconductor device may comprise: designing a layout; forming a photomask based on the layout; correcting an optical transmittance of the photomask; and performing a photolithography process using the photomask having the corrected optical transmittance to form a pattern on a substrate. The correcting the optical transmittance of the photomask may comprise: creating an intensity map by capturing light that passes through the photomask; simulating the layout to create a virtual intensity map; and correcting an optical transmittance of a mask substrate of the photomask based on the intensity map and the virtual intensity map.

According to some example embodiments of the present inventive concepts, a method of fabricating a semiconductor device may comprise: designing a layout; forming a photomask based on the layout; correcting an optical transmittance of the photomask; and performing a photolithography process using the photomask having the corrected optical transmittance to form a pattern on a substrate. The correcting the optical transmittance of the photomask may comprise: separating the layout into a plurality of grid sections; obtaining an optical intensity of each of the plurality of grid sections; and creating a virtual intensity map based on the optical intensity of each of the plurality of grid sections.

According to some example embodiments of the present inventive concepts, a method of fabricating a semiconductor device may comprise: designing a layout that includes a first region and a second region, the first region having a pattern density that is different from a pattern density of the second region; forming a photomask based on the layout, the photomask including a first part formed based on the first region and a second part formed based on the second region; capturing light that passes through the first part and the second part of the photomask to create a first pixel and a second pixel, respectively; simulating the first region and the second region of the layout to create a first virtual pixel and a second virtual pixel, respectively; correcting an optical transmittance of a mask substrate of the photomask based on the first pixel, the first virtual pixel, the second pixel, and the second virtual pixel; and performing a photolithography process using the photomask having the corrected optical transmittance to form a pattern on a substrate.

BRIEF DESCRIPTION OF THE DRAWINGS

FIG. 7 illustrates a cross-sectional view showing creating an intensity map of a photomask.

FIG. 10 illustrates a simplified plan view showing a layout of the mask pattern region depicted in FIG. 6A.

DETAILED DESCRIPTION

Figure 1:
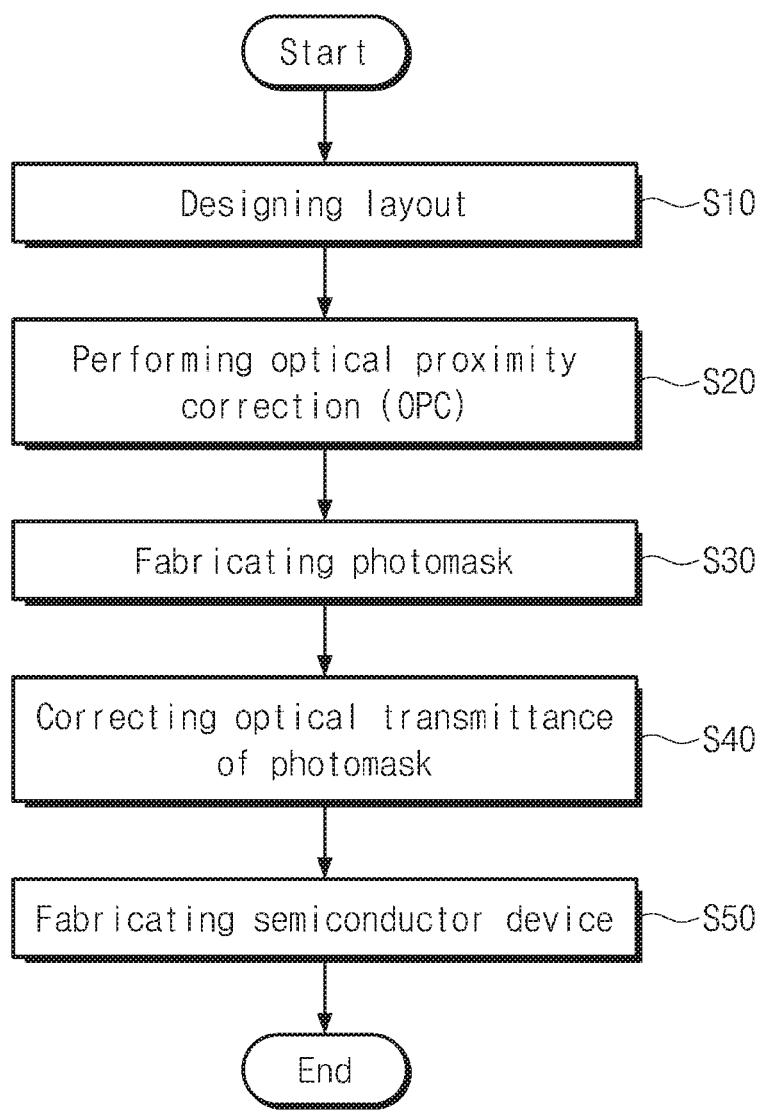
FIG. 1 illustrates a flow chart showing a method of designing and fabricating a semiconductor device according to some example embodiments of the present inventive concepts.

FIG. 1 illustrates a flow chart showing a method of designing and fabricating a semiconductor device according to some example embodiments of the present inventive concepts.

Referring to FIG. 1, a layout design step may be performed to achieve a semiconductor integrated circuit on a silicon substrate (a first step, S10). The layout design step may include a routing step that places and connects various standard cells provided from a cell library, based on a prescribed design rule.

The cell library for the layout design step may include information about operation, speed, and power consumption of the standard cell. A cell library for representing a layout of a specific gate-level circuit as a layout may be defined in the layout design tool. The layout design step may be a step for defining shapes and/or dimensions of patterns constituting transistors and metal lines that will be actually formed on the silicon substrate. For example, in order to actually form an inverter circuit on a silicon substrate, a layout of certain patterns such as PMOS, NMOS, N-WELL, gate electrodes, and/or metal lines may be prepared (e.g., drawn, printed, transcribed) thereon. For this, a search may be first performed to select a suitable one of inverters predefined in the cell library.

A routing step may be performed on the selected and placed standard cells. For example, the routing step may be performed to connect the selected and placed standard cells to their overlying lines. The standard cells may be connected to each other through the routing step. A series of these steps may be automatically or manually performed in the layout design tool. A step of placing and routing the standard cells may be automatically performed by an additional Place & Routing tool.

After the routing step, a verification step may be performed on the layout to check whether any portion of the schematic circuit violates the given design rule. The verification step may include a design rule check (DRC) for verifying whether the layout meets the given design rule, an electrical rule check (ERC) for verifying whether there is an issue of an electrical disconnection in the layout, and/or a layout vs. schematic (LVS) for verifying whether the layout is coincident with the gate-level netlist.

An optical proximity correction (OPC) step may be performed (a second step, S20). A photolithography process may be employed to achieve on a silicon substrate the layout patterns obtained by the layout design step. The optical proximity correction step may be a technique for correcting an unintended optical effect that occurred in the photolithography process. For example, the optical proximity correction step may correct an undesirable phenomenon, such as refraction and/or process side effects caused by characteristics of light in an exposure process using the layout patterns. When the optical proximity correction step is performed, the designed layout patterns may be slightly changed (or biased) in shapes and/or positions.

A photomask may be fabricated based on the layout changed by the optical proximity correction step (a third step, S30). The photomask may generally be fabricated by describing the layout patterns using a chromium layer coated on a mask substrate (e.g., a quartz substrate).

A step may be performed to correct an optical transmittance of the photomask (a fourth step, S40). The correction of the optical transmittance of the photomask will be further discussed in detail below (refer to FIGS. 5 and 16, for example). The correction of the optical transmittance of the fabricated photomask may prevent (or reduce) process failure of a photolithography process.

The photomask having the corrected optical transmittance may be used to fabricate a semiconductor device (a fifth step, S50). Through the photolithography process using the photomask having the corrected optical transmittance, patterns defined in the layout design step may be sequentially formed on a silicon substrate.

Figure 2:
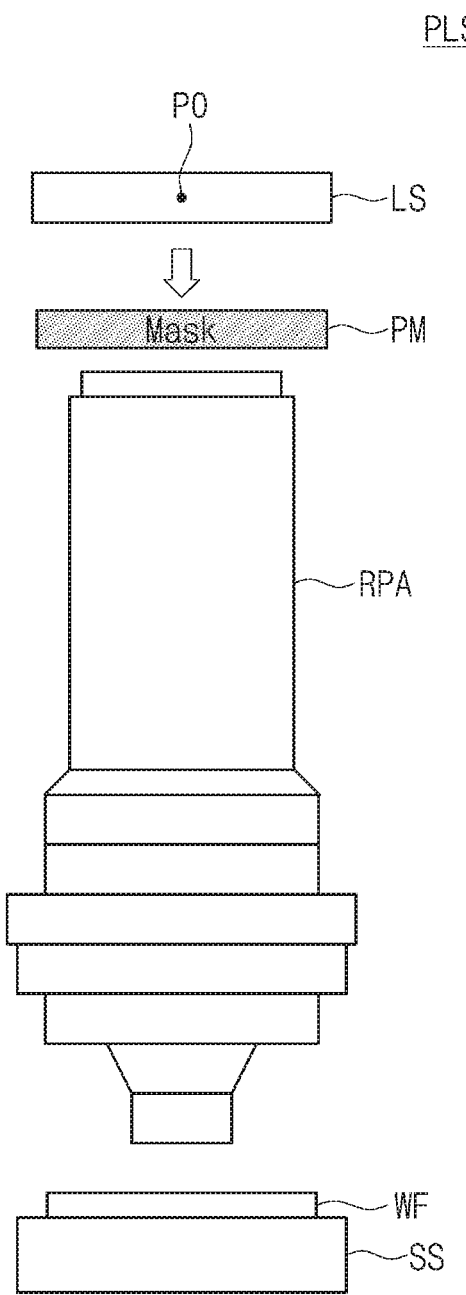
FIG. 2 illustrates a conceptual diagram showing a photolithography system that uses a photomask fabricated according to some example embodiments of the present inventive concepts.

FIG. 2 illustrates a conceptual diagram showing a photolithography system that uses a photomask fabricated according to some example embodiments of the present inventive concepts.

Referring to FIG. 2, a photolithography system PLS may include a light source LS, a photomask PM, a reduction projection apparatus RPA, a substrate WF, and a substrate stage SS. The photomask PM may be fabricated through the first, second, third, and fourth steps S10, S20, S30, and S40 that are discussed above with reference to FIG. 1. The photolithography system PLS may further include components that are not shown in FIG. 2. For example, the photolithography system PLS may further include a sensor used for measuring height and slope of the surface of the substrate WF.

The light source LS may emit light. The light emitted from the light source LS may travel toward the photomask PM. In some example embodiments, a sensor (not shown) may be provided between the light source LS and the photomask PM to adjust a focus of the light. The light source LS may include an ultraviolet ray source (e.g., a krypton fluoride (KrF) light source with 234 nm wavelength or an argon fluoride (ArF) light source with 193 nm wavelength). In some example embodiments, the light source LS may include a single point light source PO, but the present inventive concepts are not limited thereto. In some other example embodiments, the light source LS may include a multi-point light source.

The photomask PM may include mask patterns to prepare (e.g., draw, print, transcribe) the designed layout on the substrate WF. For example, the mask patterns may block light emitted from the light source LS, and an area where no mask patterns are formed may be transparent to light emitted from the light source LS.

The reduction projection apparatus RPA may receive light that passes through the photomask PM. The reduction projection apparatus RPA may match layout patterns to be printed on the substrate WF with the mask patterns of the photomask PM. The substrate stage SS may support the substrate WF. For example, the substrate WF may include a silicon wafer.

The reduction projection apparatus RPA may include an aperture. The aperture may be used to raise a depth of focus (DOF) of an ultraviolet ray emitted from the light source LS. For example, the aperture may include a dipole aperture or a quadruple aperture. The reduction projection apparatus RPA may further include a lens to adjust a focus of light.

The reduction projection apparatus RPA may provide the substrate WF with light that passes through the photomask PM. Therefore, resist patterns corresponding to the mask patterns on the photomask PM may be prepared (e.g., drawn, printed, or transcribed) on the substrate WF.

Figure 3:
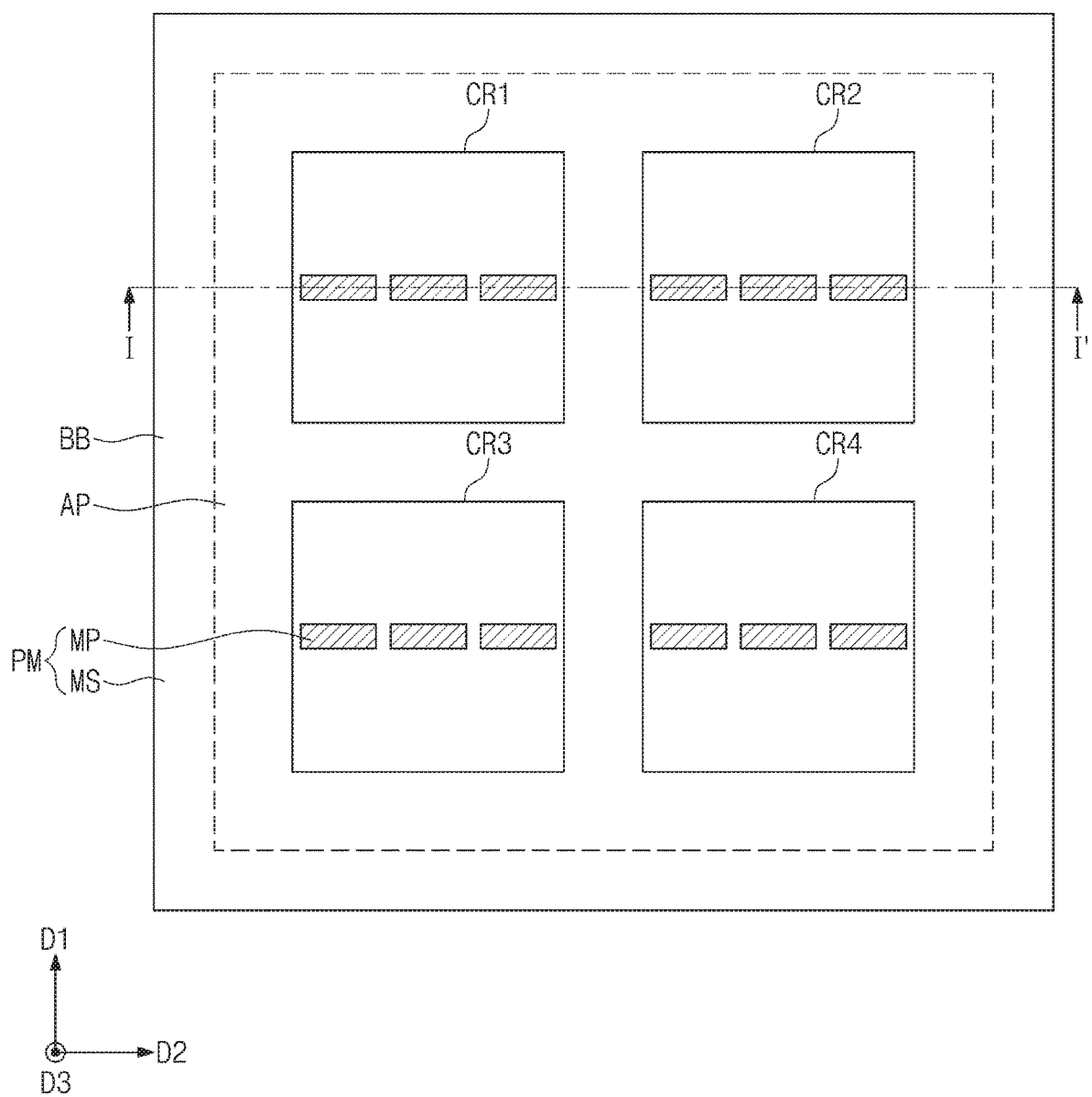
FIG. 3 illustrates a plan view showing a reticle including a photomask according to some example embodiments of the present inventive concepts.
Figure 4:
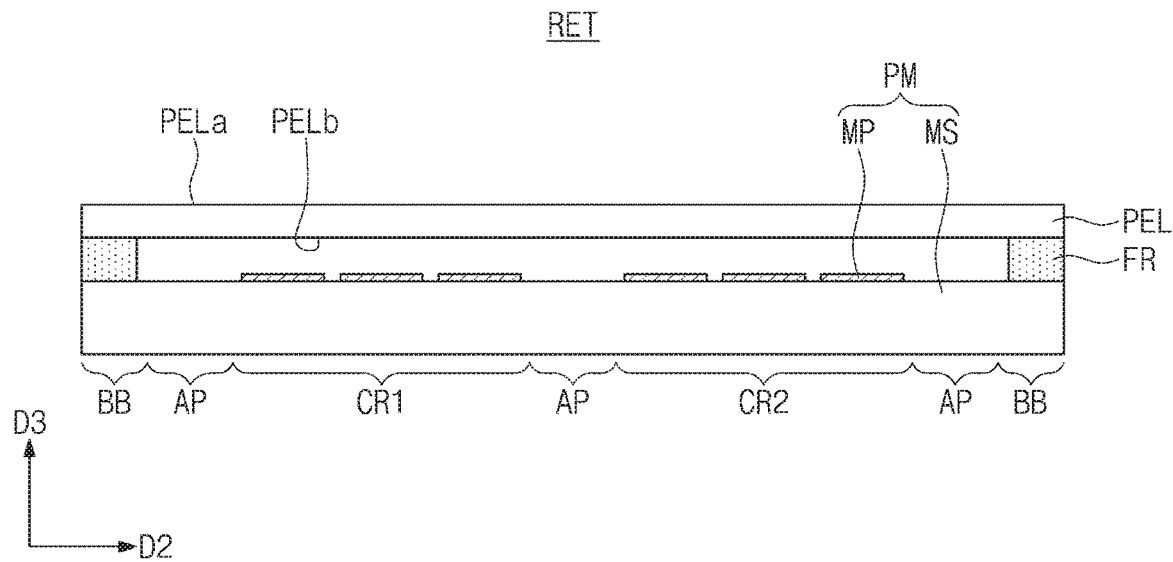
FIG. 4 illustrates a cross-sectional view taken along line I-I' of FIG. 3.

FIG. 3 illustrates a plan view showing a reticle including a photomask according to some example embodiments of the present inventive concepts. FIG. 4 illustrates a cross-sectional view taken along line I-I' of FIG. 3.

Referring to FIGS. 2, 3, and 4, a reticle RET may include the photomask PM, a pellicle PEL to protect the photomask PM, and a frame FR between the photomask PM and the pellicle PEL. The reticle RET including the photomask PM may be engaged with the photolithography system PLS of FIG. 2, and thus a photolithography process may be performed on the substrate WF.

The photomask PM may include a mask substrate MS and mask pattern regions MP on the mask substrate MS. Each of the mask pattern regions MP may include a plurality of fine mask patterns. For example, the mask substrate MS may be a quartz substrate, and the mask pattern region MP may include chromium patterns (or mask patterns). The mask substrate MS may include first to fourth chip regions CR1 to CR4 to transcribe resist patterns to the substrate WF. The mask pattern regions MP may be disposed on the first to fourth chip regions CR1 to CR4.

The first to fourth chip regions CR1 to CR4 may be substantially the same as (or similar to) each other. The first to fourth chip regions CR1 to CR4 may correspondingly transcribe resist patterns to first to fourth dies of the substrate WF. For example, each of the first to fourth chip regions CR1 to CR4 may corresponding to a single die of the substrate WF, respectively.

The mask substrate MS may include an auxiliary pattern region AP that surrounds each of the first to fourth chip regions CR1 to CR4, and may also include a black border region BB on an edge of the mask substrate MS.

The auxiliary pattern region AP may be provided thereon with an auxiliary pattern (not shown) that does not constitute a desired integrated circuit. The auxiliary pattern may include a pattern, such as an alignment key, which may be used to fabricate an integrated circuit, but is not left on a resultant semiconductor chip. The auxiliary pattern region AP may correspond to a scribe lane of the substrate WF, and thus the auxiliary pattern on the auxiliary pattern region AP may be transcribed to the scribe lane of the substrate WF. The black border region BB may be a non-pattern region that does not include a pattern element to transcribe a pattern to the substrate WF.

The pellicle PEL may have a first surface PELa exposed to the outside (e.g., facing externally). The pellicle PEL may have a second surface PELb that faces the photomask PM (e.g., facing internally). The frame FR may be interposed between the pellicle PEL and the photomask PM. The frame FR may separate the pellicle PEL from the photomask PM. The frame FR may be provided on the black border region BB of the mask substrate MS. Although not shown, an adhesive layer may be interposed between the pellicle PEL and the frame FR, and an adhesive layer may also be interposed between the frame FR and the mask substrate MS.

The pellicle PEL may protect the photomask PM against external contaminants (e.g., dust and/or resist). In the absence of the pellicle PEL on the photomask PM, external contaminants may otherwise be adhered to the photomask PM, and thus various problems may occur in a photolithography process.

Figure 5:
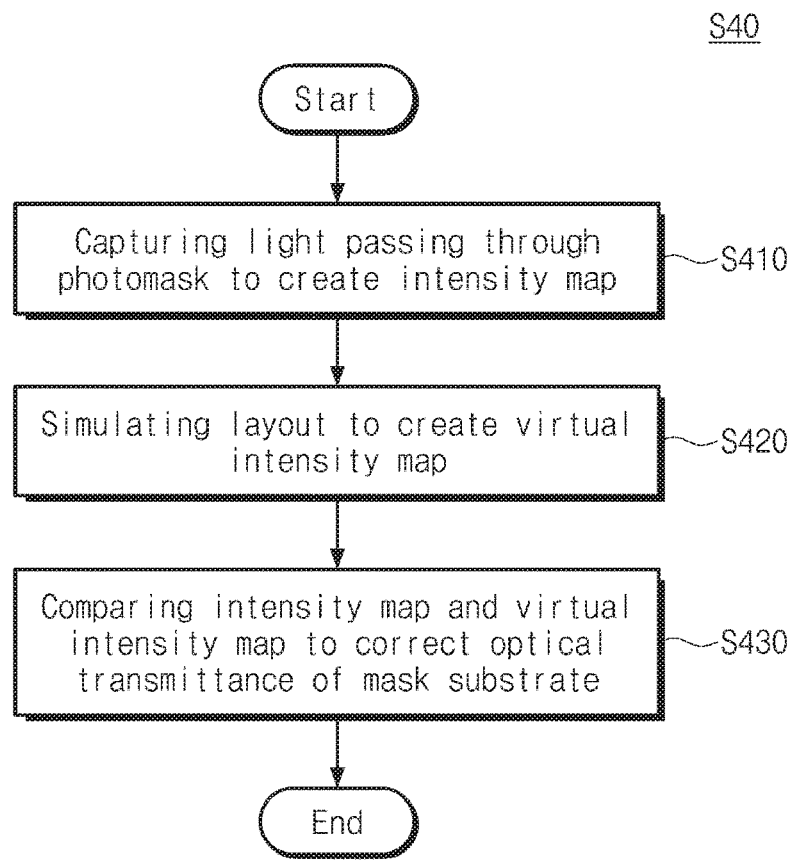
FIG. 5 illustrates a flow chart showing a method of correcting an optical transmittance of a photomask according to some example embodiments of the present inventive concepts.
Figure 6A:
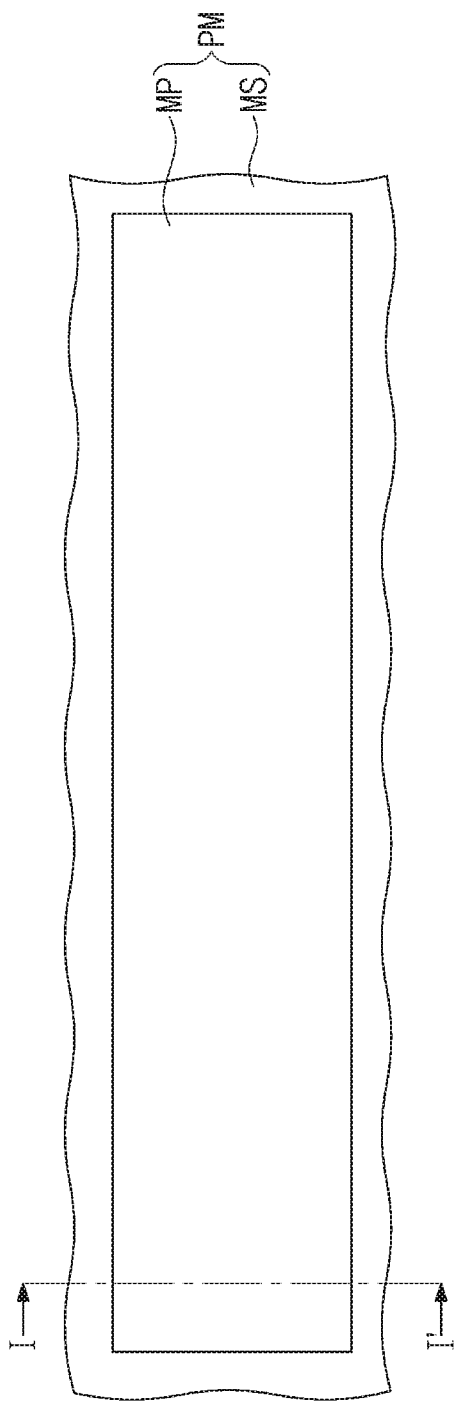
FIG. 6A illustrates a plan view showing a mask pattern region of the photomask depicted in FIGS. 3 and 4.
Figure 6B:
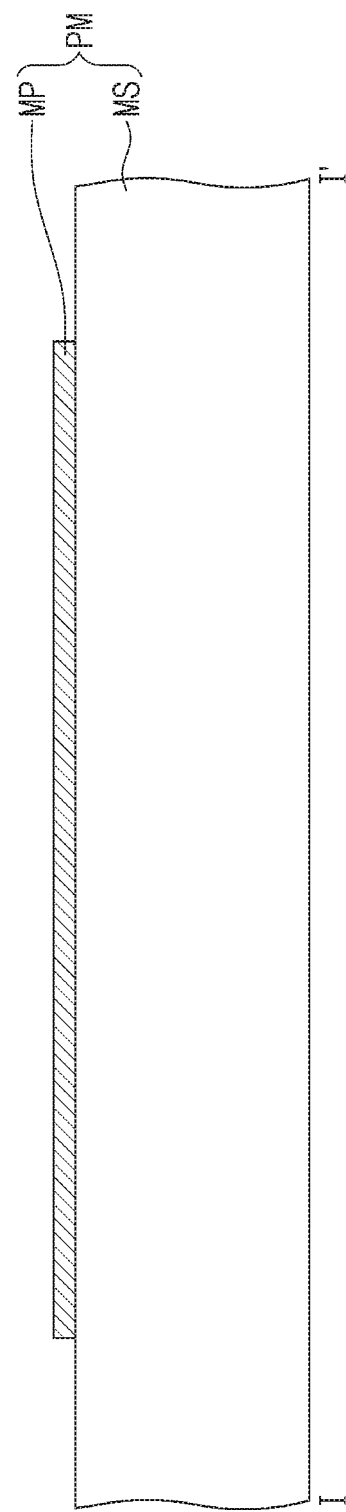
FIG. 6B illustrates a cross-sectional view taken along line I-I' of FIG. 6A.
Figure 8:
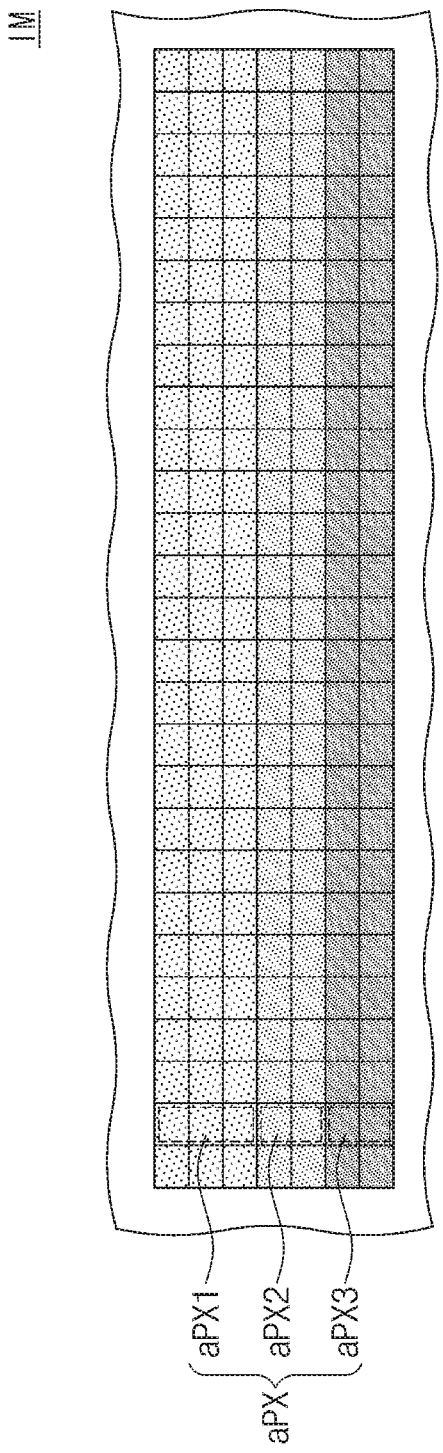
FIG. 8 illustrates an intensity map of the mask pattern region shown in FIG. 6A.

FIG. 5 illustrates a flow chart showing a method of correcting an optical transmittance of a photomask according to some example embodiments of the present inventive concepts. FIG. 6A illustrates a plan view showing a mask pattern region of the photomask depicted in FIGS. 3 and 4. FIG. 6B illustrates a cross-sectional view taken along line I-I' of FIG. 6A. FIG. 7 illustrates a cross-sectional view showing creating an intensity map of a photomask. FIG. 8 illustrates an intensity map of the mask pattern region shown in FIG. 6A.

As shown in FIG. 5, the correction of an optical transmittance of a photomask (step S40 of FIG. 1) may include creating an intensity map by capturing light that passes through the photomask (S410), creating a virtual intensity map by simulating a layout (S420), and correcting an optical transmittance of a mask substrate of the photomask based on comparing the intensity map with the virtual intensity map (S430).

Referring to FIGS. 5, 6A, 6B, 7, and 8, an intensity map IM may be created by capturing light that passes through the photomask PM (S410). The intensity map IM may represent intensity of light incident on the substrate WF of FIG. 2 at the time when the substrate WF receives light that passes through the photomask PM. The intensity map IM may be an image that expresses an optical transmittance of the photomask PM. For example, the intensity map IM may be an image that represents a charge-coupled device (CCD) image.

Specifically, referring back to FIGS. 6A and 6B, the photomask PM may be prepared that is fabricated based on a layout. As discussed above with reference to FIG. 4, the photomask PM may include the mask substrate MS and the mask pattern region MP on the mask substrate MS.

Referring back to FIGS. 7 and 8, the photomask PM may be disposed on an image capturing unit IS. For example, the image capturing unit IS may include a charge-coupled device (CCD) camera. A light L1 may be incident on the photomask PM. The image capturing unit IS may receive the light L1 that passes through the photomask PM. The image capturing unit IS may capture the incident light L1 and create the intensity map IM. FIG. 8 shows the created intensity map IM. The intensity map IM of FIG. 8 may be an image about the mask pattern region MP of FIG. 6A.

Intensity of the light L1 may become reduced while the light L1 passes through the photomask PM. As a first factor of reduction in the intensity of the light L1, mask patterns of the mask pattern region MP may reduce the intensity of the light L1. An optical transmittance of the mask pattern region MP may be changed (e.g., may be different or may vary) depending on locations based on density of the mask patterns, respectively.

As a second factor of reduction in the intensity of the light L1, the mask substrate MS may reduce the intensity of the light L1. An optical transmittance of the mask substrate MS may be changed (e.g., may be different or may vary) depending on locations. The variation in the optical transmittance of the mask substrate MS may be attributable to defects that the mask substrate MS is irregularly formed, for example.

Due to the first and second factors of reduction in the intensity of the light L1, the intensity of the light L1 may be changed (e.g., may be different or may vary) depending on incident regions of the image capturing unit IS. For example, the intensity of the light L1 incident on a first part PA1 of the image capturing unit IS may be greater than that of the light L1 incident on a second part PA2 of the image capturing unit IS. The intensity of the light L1 incident on the second part PA2 of the image capturing unit IS may be greater than that of the light L1 incident on a third part PA3 of the image capturing unit IS. However, example embodiments are not limited thereto.

The intensity map IM created by the image capturing unit IS may include a plurality of image pixels aPX. An image pixel aPX may represent a value based on the intensity of the light L1 incident on the image pixel aPX. For example, the image pixel aPX may have brightness and/or color based on the intensity of the light L1 incident on the image pixel aPX.

The plurality of image pixels aPX may include a first image pixel aPX1, a second image pixel aPX2, and a third image pixel aPX3 that are adjacent to (or near) each other, for example. The first, second, and third image pixels aPX1, aPX2, and aPX3 may have light intensities different from each other. The optical intensity of the first image pixel aPX1 may be greater than that of the second image pixel aPX2; for example, the brightness of the first image pixel aPX1 may be greater than that of the second image pixel aPX2. The optical intensity of the second image pixel aPX2 may be greater than that of the third image pixel aPX3; for example, the brightness of the second image pixel aPX2 may be greater than that of the third image pixel aPX3. This may be because the first image pixel aPX1 is a pixel corresponding to the first part PA1 of the image capturing unit IS of FIG. 7, the second image pixel aPX2 is a pixel corresponding to the second part PA2 of the image capturing unit IS of FIG. 7, and the third image pixel aPX3 is a pixel corresponding to the third part PA3 of the image capturing unit IS of FIG. 7. However, example embodiments are not limited thereto.

Figure 9:
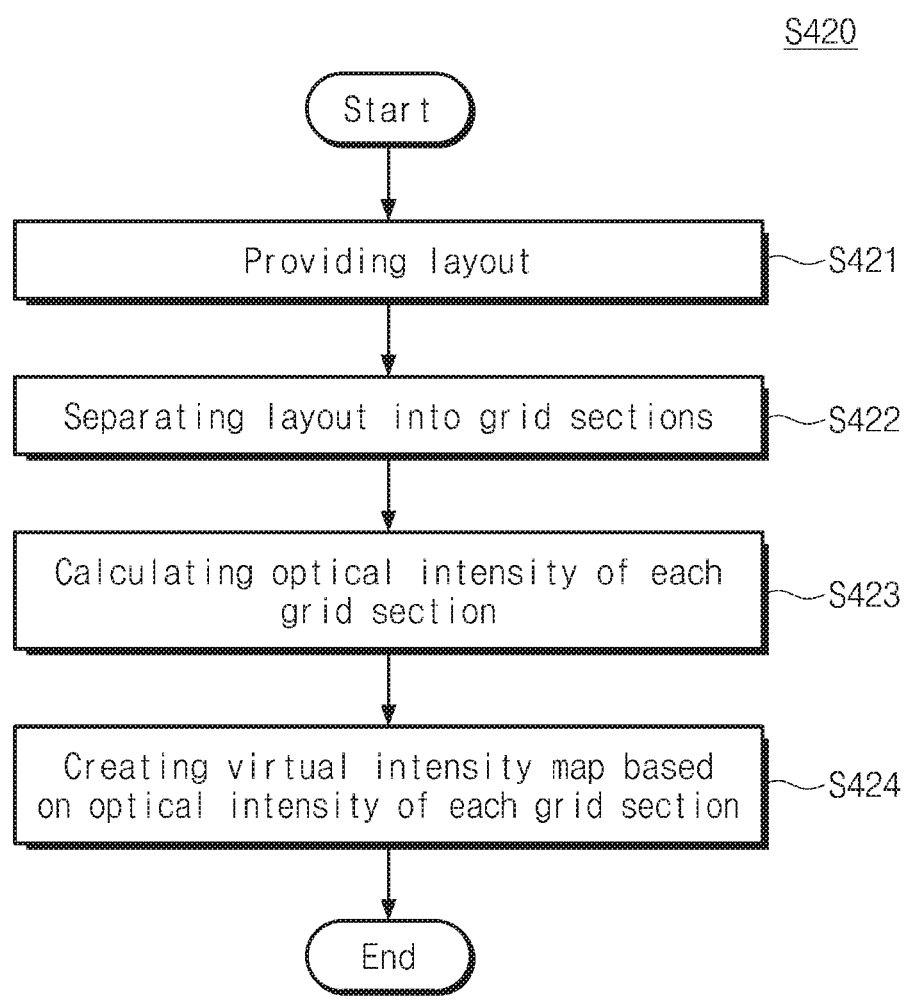
FIG. 9 illustrates a detailed flow chart showing a step of creating a virtual intensity map, shown in the flow chart of FIG. 5.
Figure 15:
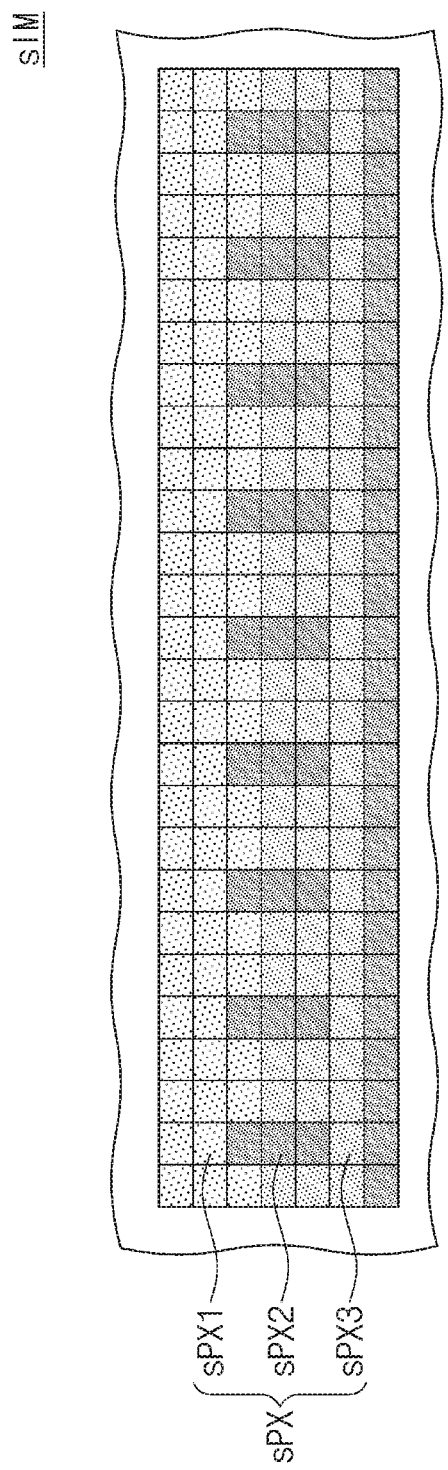
FIG. 15 illustrates a plan view showing a virtual intensity map corresponding to the intensity map depicted in FIG. 8.

FIG. 9 illustrates a detailed flow chart showing a step of creating a virtual intensity map, shown in the flow chart of FIG. 5. FIG. 10 illustrates a simplified plan view showing a layout of the mask pattern region depicted in FIG. 6A. FIGS. 11A, 12A, 13A, and 14A illustrate enlarged plan views showing a first region of FIG. 10. FIGS. 11B, 12B, 13B, and 14B illustrate enlarged plan views showing a second region of FIG. 10. FIG. 15 illustrates a plan view showing a virtual intensity map corresponding to the intensity map of FIG. 8.

Referring to FIGS. 5, 9, and 10, a layout L0 may be simulated to create a virtual intensity map (S420). For example, referring back to FIGS. 9 and 10, the layout L0 may be provided as a basis of the mask pattern region MP of FIG. 6A (S421). The layout L0 of FIG. 9 may be a layout that undergoes the optical proximity correction (OPC) step (S20) discussed above with reference to FIG. 1. For example, the layout L0 of FIG. 9 may be used as a basis to fabricate the photomask PM of FIGS. 6A and 6B.

The layout L0 may include a first region RG1 and a second region RG2, as shown in FIG. 10. The first region RG1 may correspond to the first image pixel aPX1 of FIG. 8, and the second region RG2 may correspond to the second image pixel aPX2 of FIG. 8. The first region RG1 and the second region RG2 may have substantially the same size.

Figure 11A:
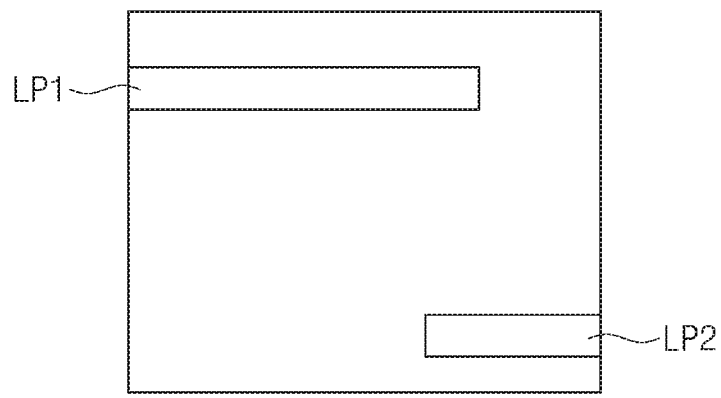
FIGS. 11A, 12A, 13A, and 14A illustrate enlarged plan views showing a first region of FIG. 10.
Figure 11B:
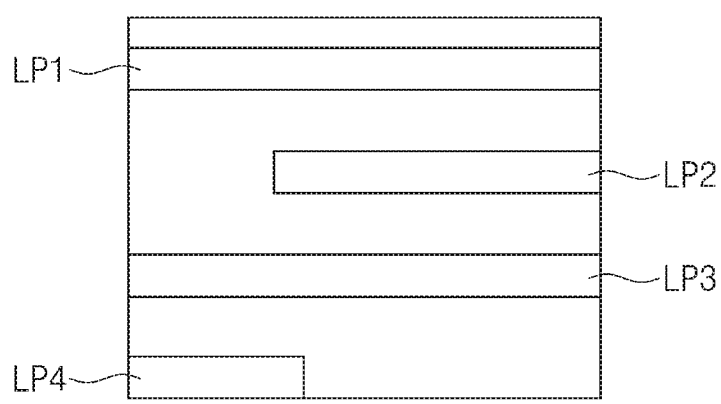
FIGS. 11B, 12B, 13B, and 14B illustrate enlarged plan views showing a second region of FIG. 10.

The following will describe an example in which the first and second regions RG1 and RG2 of the layout L0 are used to create a virtual intensity map. Referring to FIGS. 9, 11A, and 11B, the first region RG1 may include a first layout pattern LP1 and a second layout pattern LP2. The second region RG2 may include a first layout pattern LP1, a second layout pattern LP2, a third layout pattern LP3, and a fourth layout pattern LP4. Thus, the first region RG1 may include two layout patterns, and the second region RG2 may include four layout patterns, for example, although example embodiments are not limited thereto. Because the first region RG1 and the second region RG2 have substantially the same size (or area), while the second region RG2 has a greater number of layout patterns than the first region RG1, the second region RG2 may have a pattern density greater than that of the first region RG1.

Figure 12A:
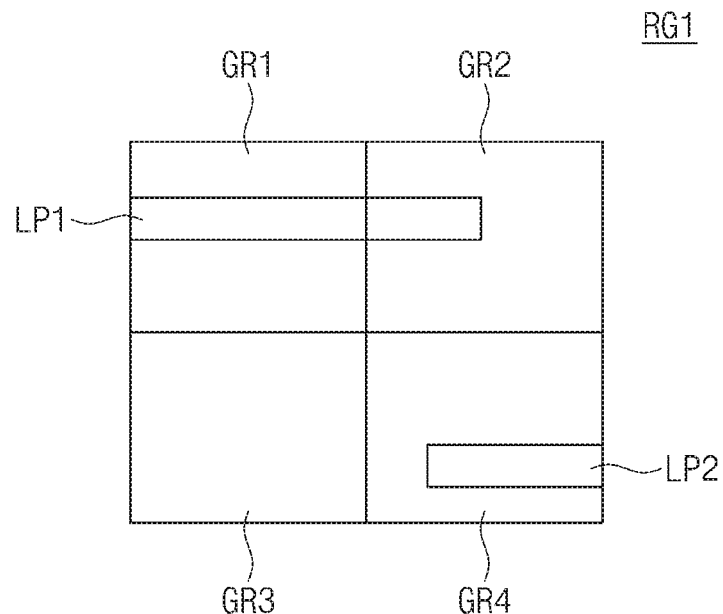
Figure 12B:
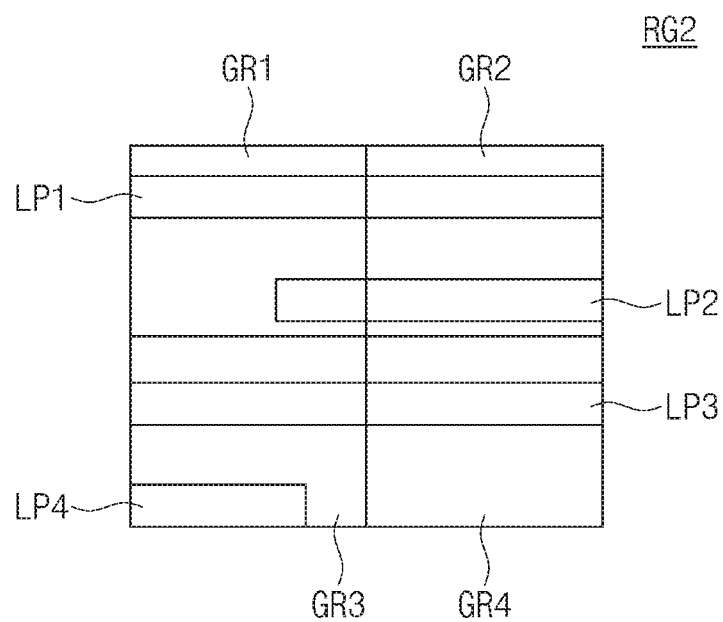

Referring to FIGS. 9, 12A, and 12B, the layout L0 may be separated into a plurality of grid sections (S422). For example, each of the first and second regions RG1 and RG2 may be separated into first to fourth grid sections GR1 to GR4. The first to fourth grid sections GR1 to GR4 may have substantially the same size.

The first layout pattern LP1 may be placed (or disposed) on the first grid section GR1 of the first region RG1. A portion of the first layout pattern LP1 may be placed (or disposed) on the second grid section GR2 of the first region RG1. No layout pattern may be placed (or disposed) on the third grid section GR3 of the first region RG1. The second layout pattern LP2 may be placed (or disposed) on the fourth grid section GR4 of the first region RG1. However, example embodiments are not limited thereto.

The first layout pattern LP1 and a portion of the second layout pattern LP2 may be placed on the first grid section GR1 of the second region RG2. The first layout pattern LP1 and the second layout pattern LP2 may be placed on the second grid section GR2 of the second region RG2. The third layout pattern LP3 and the fourth layout pattern LP4 may be placed on the third grid section GR3 of the second region RG2. The third layout pattern LP3 may be placed on the fourth grid section GR4 of the second region RG2. However, example embodiments are not limited thereto.

Figure 13A:
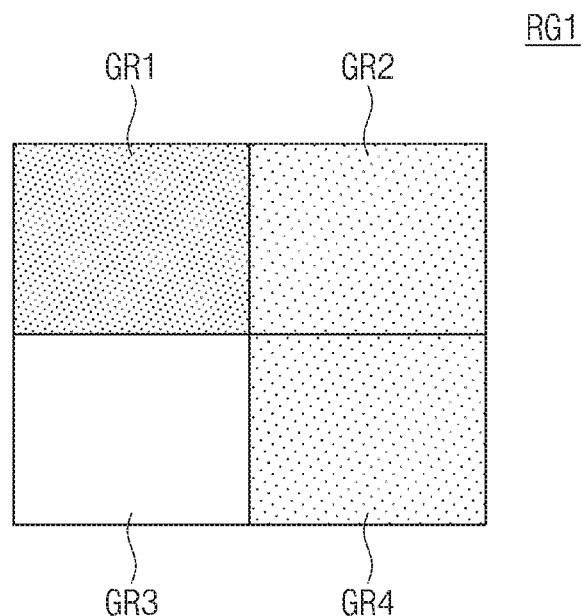
Figure 13B:
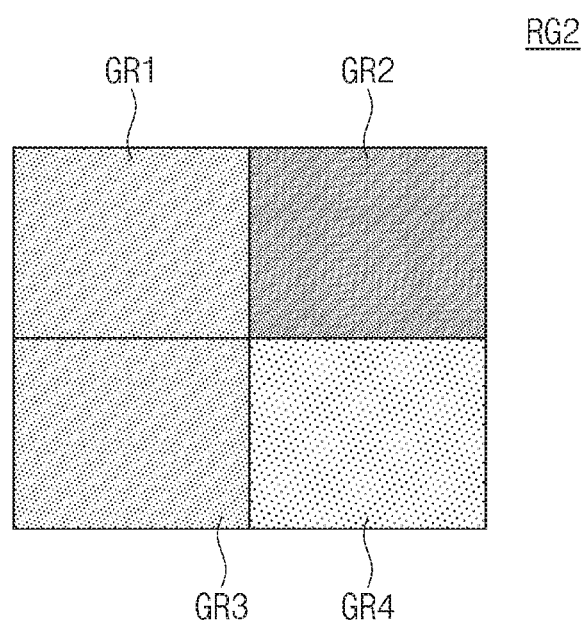
Figure 14A:
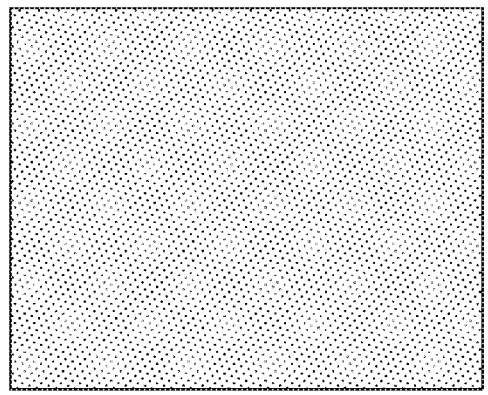
Figure 14B:
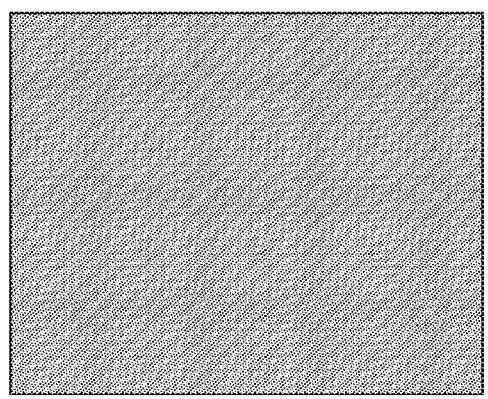

Referring to FIGS. 9, 13A, and 13B, an optical intensity may be calculated for each grid section (S423). For example, the optical intensity of a grid section may be calculated through simulation based on a pattern density of the grid section. The pattern density may be a ratio of area (or size) of the layout pattern(s) in the grid section to area (or size) of the grid section. The simulation may include an optical proximity correction (OPC) model simulation or an optic model simulation. For example, the calculated optical intensity may indicate as brightness and/or color of the grid section.

The first grid section GR1 of the first region RG1 may have a pattern density greater than that of the second grid section GR2 of the first region RG1. The first grid section GR1 of the first region RG1 may thus have an optical intensity less than that of the second grid section GR2 of the first region RG1. This may be because an increase in pattern density may reduce an optical transmittance of a photomask, which may result in a reduction in optical intensity. The third grid section GR3 of the first region RG1 may have a pattern density of zero, and thus may have an optical intensity greater than any other grid section of the first region RG1. However, example embodiments are not limited thereto.

The first grid section GR1 of the second region RG2 may have a pattern density less than that of the second grid section GR2 of the second region RG2. The first grid section GR1 of the second region RG2 may thus have an optical intensity greater than that of the second grid section GR2 of the second region RG2. The fourth grid section GR4 of the second region RG2 may have a pattern density less than that of the first grid section GR1 of the second region RG2. The fourth grid section GR4 of the second region RG2 may thus have an optical intensity greater than that of the first grid section GR1 of the second region RG2. However, example embodiments are not limited thereto.

Referring to FIGS. 9, 14A, 14B, and 15, a virtual intensity map sIM may be created based on an optical intensity of each grid section (S424). The virtual intensity map sIM may include a plurality of virtual pixels sPX. The virtual intensity map sIM may be a simulation result that represents the intensity of light that will be incident through the photomask PM onto the substrate WF of FIG. 2. The virtual pixel sPX may use brightness and/or color to express the intensity of light that will be incident onto the substrate WF.

The virtual intensity map sIM of FIG. 15 may correspond to the intensity map IM of FIG. 8, and the virtual pixels sPX may correspond to the image pixels aPX of FIG. 8. For example, the virtual intensity map sIM may include first, second, and third virtual pixels sPX1, sPX2, and sPX3 that respectively correspond to the first, second, and third image pixels aPX1, aPX2, and aPX3 of FIG. 8.

The first virtual pixel sPX1 may be formed based on the optical intensities of the first to fourth grid sections GR1 to GR4 of the first region RG1. For example, an optical intensity of the first virtual pixel sPX1 may be calculated by averaging and correcting the optical intensities of the first to fourth grid sections GR1 to GR4 of the first region RG1. The second virtual pixel sPX2 may be formed based on the optical intensities of the first to fourth grid sections GR1 to GR4 of the second region RG2. For example, an optical intensity of the second virtual pixel sPX2 may be calculated by averaging and correcting the optical intensities of the first to fourth grid sections GR1 to GR4 of the second region RG2.

Because the pattern density of the first region RG1 is less than that of the second region RG2, a simulated optical intensity of the first virtual pixel sPX1 may be greater than that of the second virtual pixel sPX2; for example, the first virtual pixel sPX1 may have brightness greater than that of the second virtual pixel sPX2.

Of the first factor (or a factor caused by the mask patterns) and the second factor (or a factor caused by the mask substrate) of reduction in optical intensity, a result due to the first factor may be represented on the virtual intensity map sIM of FIG. 15. The virtual intensity map sIM of FIG. 15 may be an ideal result that denotes the intensity of light incident through the photomask PM onto the substrate WF of FIG. 2 under a state in which the mask substrate MS has uniform optical transmittance. For example, the virtual intensity map sIM of FIG. 15 may be an ideal result that expresses an optical transmittance of the photomask PM when the mask substrate MS has no defect.

Figure 16:
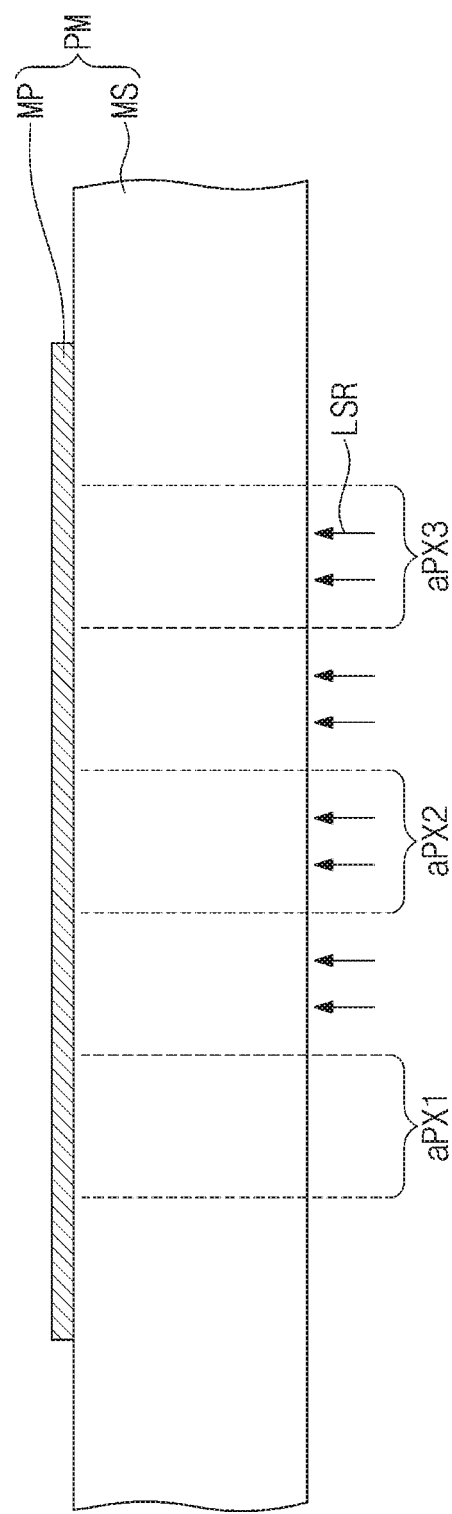
FIG. 16 illustrates a simplified cross-sectional view showing correcting an optical transmittance of a mask substrate in a photomask.

FIG. 16 illustrates a simplified cross-sectional view showing correcting an optical transmittance of a mask substrate in a photomask.

Referring to FIGS. 5, 8, 15, and 16, the intensity map IM of FIG. 8 and the virtual intensity map sIM of FIG. 15 may be compared to correct the optical transmittance of the mask substrate MS. The virtual intensity map sIM of FIG. 15 may serve as a criterion to correct the optical transmittance of the mask substrate MS. For example, the intensity map IM of FIG. 8 and the virtual intensity map sIM of FIG. 15 may be compared to find (or identify) pixels of the image pixels aPX of the intensity map IM that are different from the respectively corresponding virtual pixels sPX of the virtual intensity map sIM.

For an image pixel aPX having a difference from the corresponding virtual pixel sPX, transmittance correction may be made to a location of the mask substrate MS that corresponds to the image pixel aPX. For an image pixel aPX having no difference from the corresponding virtual pixel sPX, no transmittance correction may be made to a location of the mask substrate MS that corresponds to the image pixel aPX.

For example, the first image pixel aPX1 may have substantially the same optical intensity as that of the first virtual pixel sPX1. Thus, the first image pixel aPX1 and the first virtual pixel sPX1 may have no difference. In this case, no transmittance correction may be made to a location of the mask substrate MS that corresponds to the first image pixel aPX1.

For example, the second image pixel aPX2 may have an optical intensity greater than that of the second virtual pixel sPX2. In this case, transmittance correction may be made to a location of the mask substrate MS that corresponds to the second image pixel aPX2, and thus the second image pixel aPX2 may have a reduced optical transmittance. As a result of the transmittance correction, the second image pixel aPX2 may have substantially the same optical transmittance as that of the second virtual pixel sPX2.

For example, the third image pixel aPX3 may have an optical intensity less than that of the third virtual pixel sPX3. In this case, transmittance correction may be made to a location of the mask substrate MS that corresponds to the third image pixel aPX3, and thus the location may have an increased optical transmittance. As a result of the transmittance correction, the third image pixel aPX3 may have substantially the same optical transmittance as that of the third virtual pixel sPX3.

The correction of the optical transmittance of the mask substrate MS may include irradiating a laser LSR to the mask substrate MS, as shown in FIG. 16. For example, based on a result of comparing the image pixels aPX of the intensity map IM with the respectively corresponding virtual pixels sPX of the virtual intensity map sIM, the laser LSR may be irradiated to the location(s) of the mask substrate MS corresponding to the image pixel(s) aPX (e.g., the second image pixel aPX2 and the third image pixel aPX3 in the above-described example) of the intensity map IM that are different (e.g., that have different optical intensities) from the respectively corresponding virtual pixel(s) sPX (e.g., the second virtual pixel sPX2 and the third virtual pixel sPX3 in the above-described example) of the virtual intensity map sIM. For example, when the laser LSR is irradiated to the mask substrate MS, vacancies may be formed to change the optical transmittance of the mask substrate MS.

Referring back to FIGS. 3 and 4, after the optical transmittance of the mask substrate MS is corrected, a pellicle PEL may be disposed on the photomask PM. A frame FR may rigidly place (e.g., secure, adhere) the pellicle PEL on the photomask PM.

According to some example embodiments of the present inventive concepts, a method of fabricating a semiconductor device may include correcting an optical transmittance of a photomask, thereby preventing (or reducing) process defects possibly occurring in a photolithography process using the photomask to form a pattern on a substrate. When the optical transmittance of the photomask is corrected, the mask substrate may be modified by taking into account the factor that the mask substrate causes a change (e.g., a difference, a variation) in optical transmittance.

Although some example embodiments of the present inventive concepts have been discussed with reference to accompanying figures, it will be understood that various changes in form and details may be made therein without departing from the spirit and scope of the present inventive concepts. It therefore will be understood that the example embodiments described above are just illustrative but not limitative in all aspects.

What is claimed is:

1. A method of fabricating a semiconductor device, the method comprising:
    designing a layout;
    forming a photomask based on the layout;
    correcting an optical transmittance of the photomask; and
    performing a photolithography process using the photomask having the corrected optical transmittance to form a pattern on a substrate,
    the correcting the optical transmittance of the photomask including,
        creating an intensity map by capturing light that passes through the photomask;
        simulating the layout to create a virtual intensity map; and
        correcting an optical transmittance of a mask substrate of the photomask based on a difference between the intensity map and the virtual intensity map.

2. The method of claim 1, wherein creating the virtual intensity map comprises:
    separating the layout into a plurality of grid sections;

obtaining an optical intensity of each of the plurality of grid sections; and creating the virtual intensity map based on the optical intensity of each of the plurality of grid sections.

3. The method of claim 2, wherein
the plurality of grid sections includes,
a first grid section; and
a second grid section, a pattern density of the second grid section is greater than a pattern density of the first grid section, and the optical intensity of the first grid section is greater than the optical intensity of the second grid section.

4. The method of claim 2, wherein
the intensity map includes a plurality of image pixels,
the creating the virtual intensity map includes generating a plurality of virtual pixels that respectively correspond to the plurality of image pixels, and
each of the plurality of virtual pixels is generated by averaging the optical intensities of the plurality of grid sections.

5. The method of claim 1, wherein creating the intensity map comprises:
irradiating light to the photomask; and
capturing the light that passes through the photomask using an image capturing unit including a charge-coupled device (CCD) camera.

6. The method of claim 1, wherein
the intensity map comprises a plurality of image pixels,
the virtual intensity map comprises a plurality of virtual pixels that respectively correspond to the plurality of image pixels, and
the correcting the optical transmittance of the mask substrate of the photomask based on the intensity map and the virtual intensity map includes comparing the plurality of image pixels with the respectively corresponding plurality of virtual pixels.

7. The method of claim 1, wherein the correcting the optical transmittance of the mask substrate of the photomask includes irradiating a laser to the mask substrate.

8. A method of fabricating a semiconductor device, the method comprising:
designing a layout;
forming a photomask based on the layout;
correcting an optical transmittance of the photomask; and
performing a photolithography process using the photomask having the corrected optical transmittance to form a pattern on a substrate,
the correcting the optical transmittance of the photomask including,
separating the layout into a plurality of grid sections;
obtaining an optical intensity of each of the plurality of grid sections;
creating a virtual intensity map based on the optical intensity of each of the plurality of grid sections;
creating an intensity map by capturing light that passes through the photomask; and
correcting the optical transmittance of the photomask based on a difference between the intensity map and the virtual intensity map.

9. The method of claim 8, wherein
the intensity map includes a plurality of image pixels,
the creating the virtual intensity map includes generating a plurality of virtual pixels that respectively correspond to the plurality of image pixels, and
each of the plurality of virtual pixels is generated by averaging the optical intensities of the plurality of grid sections.

10. The method of claim 8, wherein creating the intensity map comprises:
irradiating light to the photomask; and
capturing the light that passes through the photomask using an image capturing unit including a charge-coupled device (CCD) camera.

11. The method of claim 8, wherein
the intensity map comprises a plurality of image pixels,
the virtual intensity map comprises a plurality of virtual pixels that respectively correspond to the plurality of image pixels, and
the correcting the optical transmittance of the photomask further includes comparing the plurality of image pixels with the respectively corresponding plurality of virtual pixels.

12. The method of claim 8, wherein
the plurality of grid sections includes,
a first grid section; and
a second grid section, a pattern density of the second grid section is greater than a pattern density of the first grid section, and the optical intensity of the first grid section is greater than the optical intensity of the second grid section.

13. The method of claim 8, wherein the correcting the optical transmittance of the photomask further includes using the virtual intensity map as a criterion to irradiate a laser to a mask substrate of the photomask.

14. The method of claim 8, wherein the obtaining the optical intensity of each of the plurality of grid sections includes performing a simulation based on a pattern density of each of the plurality of grid sections.

15. A method of fabricating a semiconductor device, the method comprising:
designing a layout that includes a first region and a second region, the first region having a pattern density that is different from a pattern density of the second region;
forming a photomask based on the layout, the photomask including a first part formed based on the first region and a second part formed based on the second region;
capturing light that passes through the first part and the second part of the photomask to create a first pixel and a second pixel, respectively;
simulating the first region and the second region of the layout to create a first virtual pixel and a second virtual pixel, respectively;
correcting an optical transmittance of a mask substrate of the photomask based on the first pixel, the first virtual pixel, the second pixel, and the second virtual pixel; and
performing a photolithography process using the photomask having the corrected optical transmittance to form a pattern on a substrate.

16. The method of claim 15, wherein the capturing the light that passes through the first part and the second part is performed using an image capturing unit that includes a charge-coupled device (CCD) camera.

17. The method of claim 15, wherein the simulating the first region and the second region comprises:
separating each of the first region and the second region into a plurality of grid sections; and
obtaining an optical intensity of each of the plurality of grid sections.

18. The method of claim 17, wherein
the plurality of grid sections include,
a first grid section; and
a second grid section, a pattern density of the second grid section is greater than a pattern density of the first grid section, and the optical intensity of the first grid section is greater than the optical intensity of the second grid section.

19. The method of claim 15, wherein the correcting the optical transmittance of the mask substrate of the photomask based on the first pixel, the first virtual pixel, the second pixel, and the second virtual pixel comprises:
    comparing the first pixel with the first virtual pixel and the second pixel with the second virtual pixel; and
    irradiating a laser to the mask substrate based on a result of the comparing.

* * * * *